United States Patent
Zi et al.

(10) Patent No.: US 10,466,593 B2
(45) Date of Patent: Nov. 5, 2019

(54) METHOD AND APPARATUS OF PATTERNING A SEMICONDUCTOR DEVICE

(71) Applicant: Taiwan Semiconductor Manufacturing Company, Ltd., Hsin-Chu (TW)

(72) Inventors: An-Ren Zi, Hsinchu (TW); Ching-Yu Chang, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/811,955

(22) Filed: Jul. 29, 2015

(65) Prior Publication Data

US 2017/0032961 A1  Feb. 2, 2017

(51) Int. Cl.
| | |
|---|---|
| *G03F 7/20* | (2006.01) |
| *G03F 7/32* | (2006.01) |
| *G03F 7/038* | (2006.01) |
| *G03F 7/039* | (2006.01) |
| *G03F 7/095* | (2006.01) |
| *H01L 21/027* | (2006.01) |

(52) U.S. Cl.
CPC ............ *G03F 7/2022* (2013.01); *G03F 7/038* (2013.01); *G03F 7/039* (2013.01); *G03F 7/0382* (2013.01); *G03F 7/0392* (2013.01); *G03F 7/095* (2013.01); *G03F 7/203* (2013.01); *G03F 7/322* (2013.01); *G03F 7/325* (2013.01); *H01L 21/0271* (2013.01)

(58) Field of Classification Search
None
See application file for complete search history.

(56) References Cited

U.S. PATENT DOCUMENTS

| | | | | |
|---|---|---|---|---|
| 5,600,035 A | * | 2/1997 | Kahle, II | ............. A61K 9/0004 568/932 |
| 8,216,767 B2 | | 7/2012 | Wang et al. | |

(Continued)

FOREIGN PATENT DOCUMENTS

| | | |
|---|---|---|
| CN | 102466970 A | 5/2012 |
| JP | 2003012643 A | 1/2003 |

(Continued)

OTHER PUBLICATIONS

Commereuc et al ("About the end life of novel aliphatic and aliphatic-aromatic (co)polyesters after UV-weathering: Structure/degradability relationships", Polymer Degradation and Stability, vol. 98 (2013) p. 1321-1328).*

*Primary Examiner* — Sin J Lee
(74) *Attorney, Agent, or Firm* — Haynes and Boone, LLP

(57) ABSTRACT

A method of making a semiconductor device is provided. The method includes forming a photoresist material over a substrate, the photoresist material having a polymer that includes a backbone having a segment and a linking group, the segment including a carbon chain and an ultraviolet (UV) curable group, the UV curable group coupled to the carbon chain and to the linking group; performing a first exposure process that breaks the backbone of the polymer via decoupling the linking group from the connected UV curable group of each segment; performing a second exposure process to form a patterned photoresist layer; and developing the patterned photoresist layer.

20 Claims, 9 Drawing Sheets

(56) References Cited

U.S. PATENT DOCUMENTS

| | | |
|---|---|---|
| 8,323,870 B2 | 12/2012 | Lee et al. |
| 8,580,117 B2 | 11/2013 | Kao et al. |
| 8,658,344 B2 | 2/2014 | Wang et al. |
| 8,715,919 B2 | 5/2014 | Chang et al. |
| 8,741,551 B2 | 6/2014 | Wu et al. |
| 2010/0022092 A1 | 1/2010 | Horiguchi et al. |
| 2012/0107742 A1 | 5/2012 | Lee et al. |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |

FOREIGN PATENT DOCUMENTS

| | | |
|---|---|---|
| KR | 20090088334 A | 8/2009 |
| KR | 20100000706 A | 1/2010 |

* cited by examiner

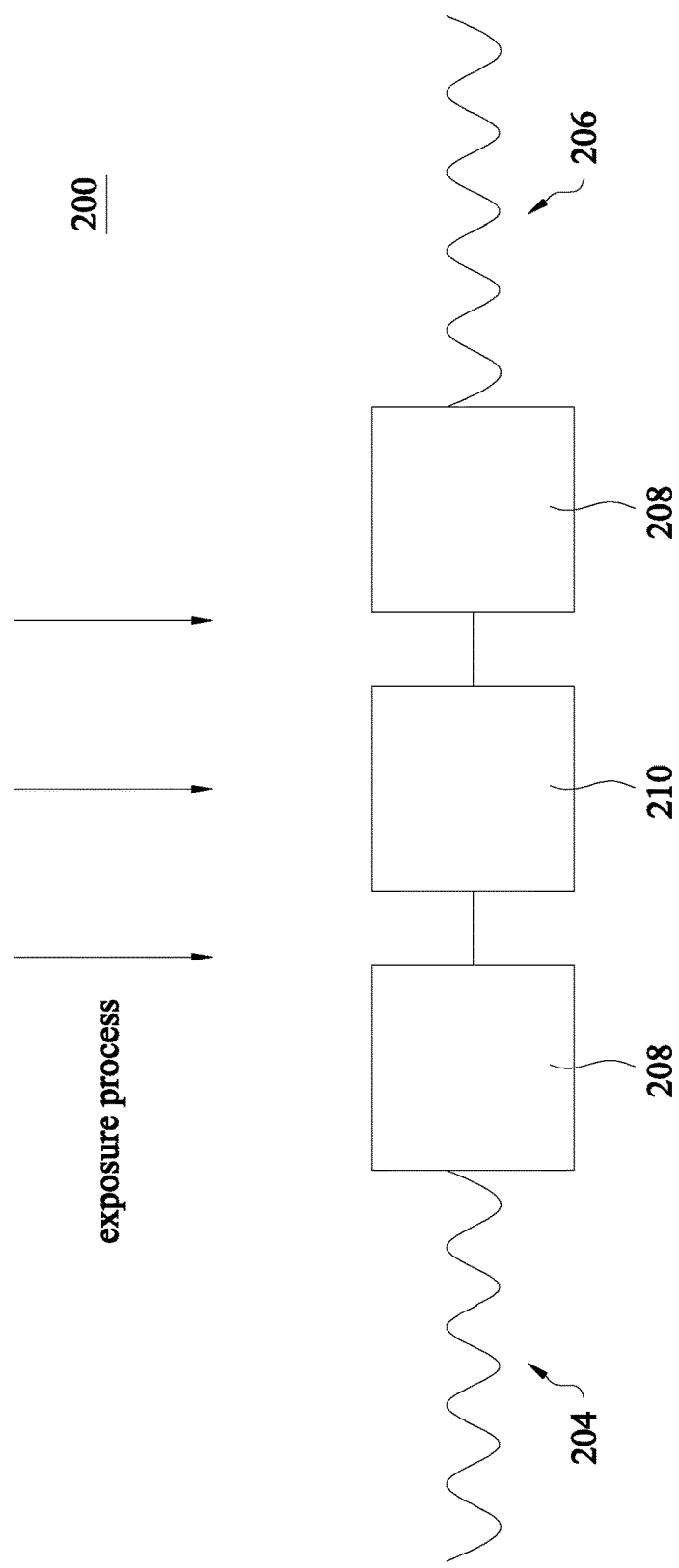

METHOD AND APPARATUS OF PATTERNING A SEMICONDUCTOR DEVICE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while feature size (i.e., the smallest component that can be created using a fabrication process) has decreased. Such accomplishment of decreasing feature size is attributable impart to improved lithography processes, such as, an extreme ultraviolet (EUV) lithography.

However, while the EUV lithography may result in smaller feature size (e.g., feature size smaller than 20 nanometers), some issues, such as increasing sizes of line edge roughness (LER) and/or line width roughness (LWR), may occur. Generally, the size of LWR may not be scaled with the decreasing feature size. That is, the smaller the feature size is, the larger percentage of the LWR is. Such increasing size of LWR and increasing percentage of LWR may disadvantageously impact performance and reliability of a later formed device. Thus, a process and material that reduce, minimize or remove issues with a patterning material are desired.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIG. 2A is an illustrated embodiment of a photoresist material prior to a treatment process according to various aspects of the present disclosure.

DETAILED DESCRIPTION

Figure 1:
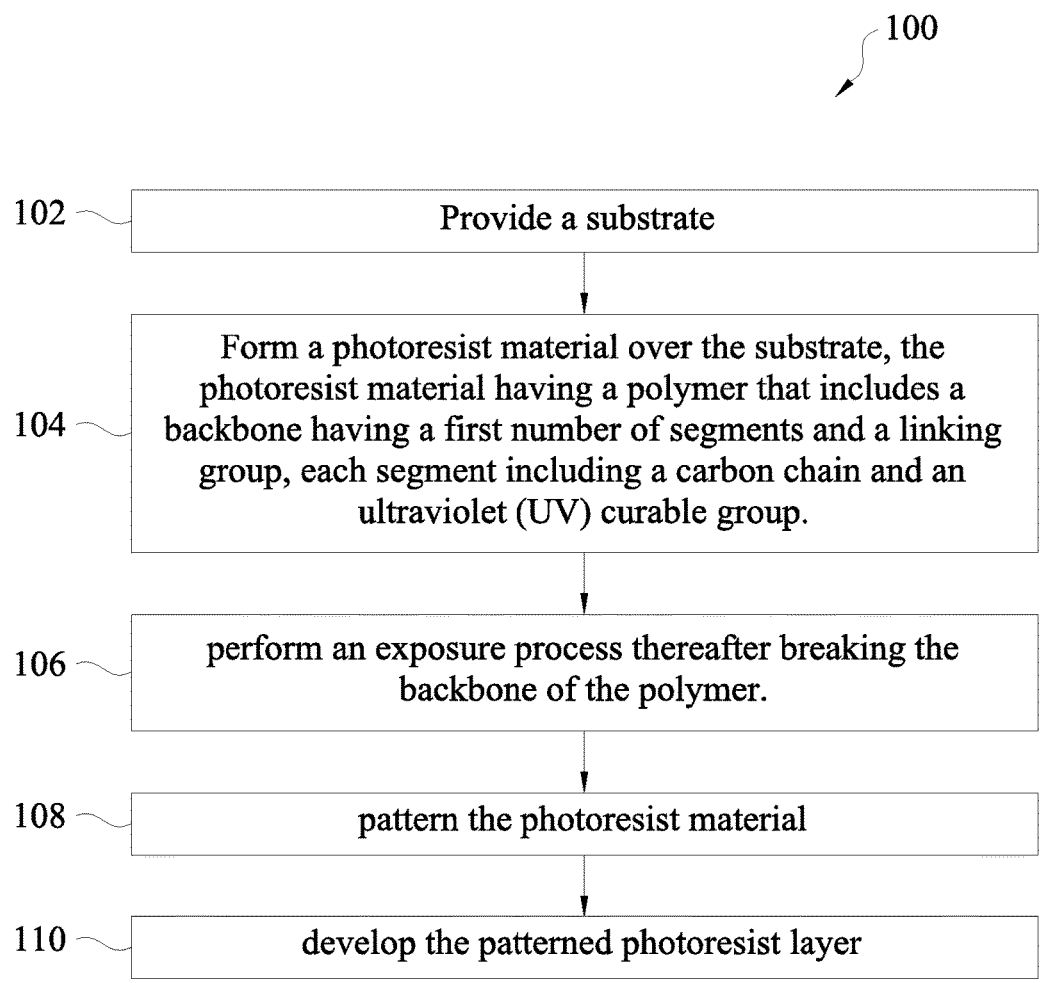
FIG. 1 is a flowchart of an embodiment of a method for making a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As the dimensions of integrated circuit components are reduced (e.g. to sub-micron dimensions), more elements are required to be put in a given area of a semiconductor integrated circuit. Accordingly, lithography processes have become more and more challenging to transfer even smaller features onto a substrate precisely and accurately without problems. Recently, an extreme ultraviolet (EUV) radiation source has been utilized to provide short exposure wavelengths so as to provide a further reduced minimum printable size on a substrate. However, at such small dimensions, the roughness of the edges of a photoresist layer has become harder to control.

The photoresist line width roughness (LWR) plays an increasingly critical role when the dimension of a semiconductor feature decreases (e.g., the dimension <20 nanometers). Such LWR may result from any number of factors, including a grain size of the polymer of the photoresist material, a grain size distribution of polymer of the photoresist material, etc. Generally, a smaller grain size of a polymer may lead to a smaller photoresist LWR and a smaller distribution (i.e., narrower distribution) of a grain size of a polymer may lead to a smaller photoresist LWR. However, conventional photoresist material used in typical manufacturing processes includes a polymer with a minimum grain size limit, around 2 nanometers. Such minimum grain size limit may result in a photoresist LWR having an undesirable size. As such, the present disclosure provides a photoresist material and corresponding fabrication methods to advantageously improve the LWR of the photoresist material.

FIG. 1 is a flowchart illustrating a method 100 of fabricating a semiconductor device in accordance with various embodiments. The method 100 starts in block 102 with providing a substrate. In some embodiments, the substrate includes silicon. In some other embodiments, the substrate may alternatively or additionally include other suitable semiconductor material, such as germanium (Ge), silicon germanium (SiGe), silicon carbide (SiC), gallium arsenic (GaAs), diamond, indium arsenide (InAs), indium phosphide (InP), silicon germanium carbide (SiGeC), and gallium indium phosphide (GaInP). The substrate may also include various features such as various doped regions, shallow trench isolation (STI) regions, source/drain features, gate stacks, dielectric features, and/or multilevel interconnects.

The method continues to block 104 with forming a photoresist material over the substrate in accordance with various embodiments. The photoresist material has a polymer that includes a backbone. The backbone has any number of segments and a plurality of linking groups. Further, each segment includes an ultraviolet (UV) curable group. Details of the photoresist material are provided in FIGS. 2A and 2B.

Referring still to FIG. 1, after the forming of the photoresist material over the substrate, the method 100 continues to block 106 by performing a first exposure process to break the backbone of the polymer. In accordance with various embodiments, the first exposure process includes no involvement of a photomask. Such breakage of the backbone of the polymer may advantageously decreases the grain size of the polymer of the photoresist material, and/or narrow the grain size distribution of the polymer of the photoresist material, which in turn decreases the photoresist LWR. In accordance with various illustrative embodiments, the first exposure process may be implemented by exposing the photoresist material under a radiation with an ultraviolet (UV) wavelength, for example, a wavelength between 10 nanometers and 400 nanometers. Still in some embodiments, the first exposure process (i.e., the block 106 in method 100) may be performed in a same chamber where the photoresist material is formed over the substrate (i.e., the block 104 in method 100). Details of breaking the backbone of the polymer are described below with respect to FIGS. 2A and 2B respectively.

The method 100 then continues to block 108 where a second exposure process in performed on the photoresist material. During the second exposure process, the substrate is exposed to a radiation beam thereby patterning the photoresist material. The radiation beam may expose the photoresist deposited on the substrate using a lithography system that provides a pattern of the radiation according to an IC design layout. In one embodiment, a lithography system includes an ultraviolet (UV) radiation, a deep ultraviolet (DUV) radiation, an extreme ultraviolet (EUV) radiation, an X-ray radiation, and/or other suitable radiation types. In alternative embodiments, a lithography system includes a charged particle lithography system, such as an electron beam or an ion beam lithography system.

It should be noted that the second exposure process performed at block 108 is different from the first exposure process performed at block 106. For example, the second exposure process at block 108 includes exposing the substrate through a photomask to thereby form a latent image in the photoresist layer. By contrast, as discussed above, the first exposure process performed at block 106 does not utilize a mask and therefor no latent image is formed in the photoresist layer. Further, in some specific embodiments, the first exposure process may involve using an UV light source as a radiation source, and the second exposure process may involve using a EUV light source as a radiation source.

The method 100 continues in block 110 where the exposed photoresist layer is developed to form a masking element. The masking element may be used to form a semiconductor device feature. A developer may be applied to the exposed photoresist to form a photoresist pattern on the substrate. Here, the photoresist layer is a negative photoresist layer being developed by a negative tone developer in block 110. The term "negative tone developer" refers to a developer that selectively dissolves and removes areas that received no exposure dose (or an exposure dose below a predetermined threshold exposure dose value). In another embodiment, a developer may include an organic solvent or a mixture of organic solvents, such as methyl a-amyl ketone (MAK) or a mixture involving the MAK. In another embodiment, a developer includes a water based developer, such as tetramethylammonium hydroxide (TMAH). Applying a developer includes spraying a developer on the exposed photoresist layer, for example by a spin-on process. In another embodiment, the photoresist layer is a positive photoresist layer being developed by a positive tone developer in block 110. The term "positive tone developer" refers to a developer that selectively dissolves and removes areas that received an exposure dose (or an exposure dose at or above a predetermined threshold exposure dose value).

The method 100 may continue with further steps not specifically described herein but understood by one of ordinary skill in the art. For example, the substrate may next be subjected to a rinsing process, such as a de-ionized (DI) water rinse. The rinsing process may remove residue particles.

FIG. 2A show a schematic view of an embodiment of a polymer 200 of the photoresist layer prior to the first exposure process (i.e., the first exposure process performed at block 106 with respect to FIG. 1). As shown in FIG. 2A, the polymer 200 includes a polymer backbone, wherein the backbone further includes a first polymer segment 204, a second polymer segment 206, an UV curable group 208 coupled to each of the first and second polymer segments 204 and 206, and a linking group 210. The first and second polymer segments may include at least one of: a polyhydroxy-styrene (PHS) polymer, an acrylate polymer, a carbon chain with 1~10 carbon atoms, and any suitable polymers known in the art. The UV curable group 208 may have a chemical formula that includes at least one of: —C(=O)S—, —C(=O)O—, —C(=O)NH—, —C(=O)ONH—, —C=CH—O—C—, —C=CH—C(=O)O—, —O—C(=O)O—, and $Si(OCH_3)_n$, n=1~3. Regarding the linking group 210, the linking group 210 may include aromatic compounds and/or aliphatic compounds. More specifically, the linking group 210 may include branched-chain/unbranched-chain, cyclic/noncyclic saturated carbon chains (with 1~9 carbon atoms) with attached hydrogen, oxygen, and/or halogen family, such as alkene compounds, alkyl compounds, and/or benzene compounds.

Figure 2B:
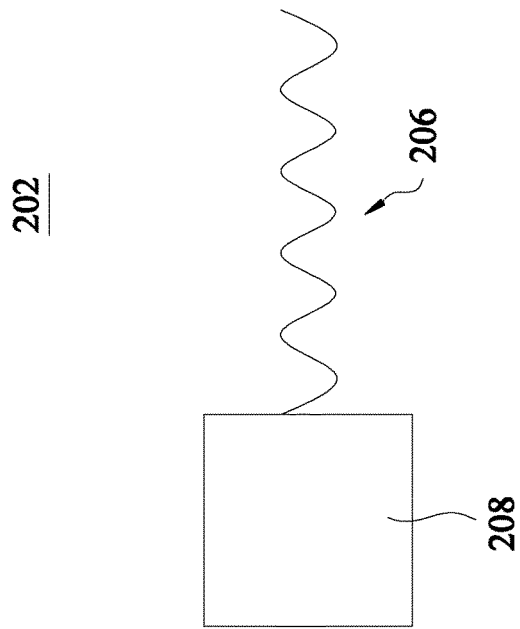
FIG. 2B is an illustrated embodiment of a photoresist material after a treatment process according to various aspects of the present disclosure.

Still referring to FIG. 2A, by exposing the photoresist layer under an UV radiation 202, the polymer backbone may divide into at least two segments. FIG. 2B shows a schematic view of an embodiment of the polymer 200 of the photoresist layer after the first exposure process (i.e., the first exposure process performed at block 106 with respect to FIG. 1). As shown in FIG. 2B, after the UV exposure process, the first polymer segment 204 and the second polymer segment 206 are disconnected from each other by abandoning the linking group 210, which, in turn, breaks the polymer backbone into at least two polymer segments. Such breakage of the polymer backbone may advantageously provide a smaller grain size of polymer as discussed above. In an embodiment, after the UV exposure process, an cationic photopolymerization process may occur for the UV curable group 208, and thus result in the breakage of the polymer backbone.

Figure 3:
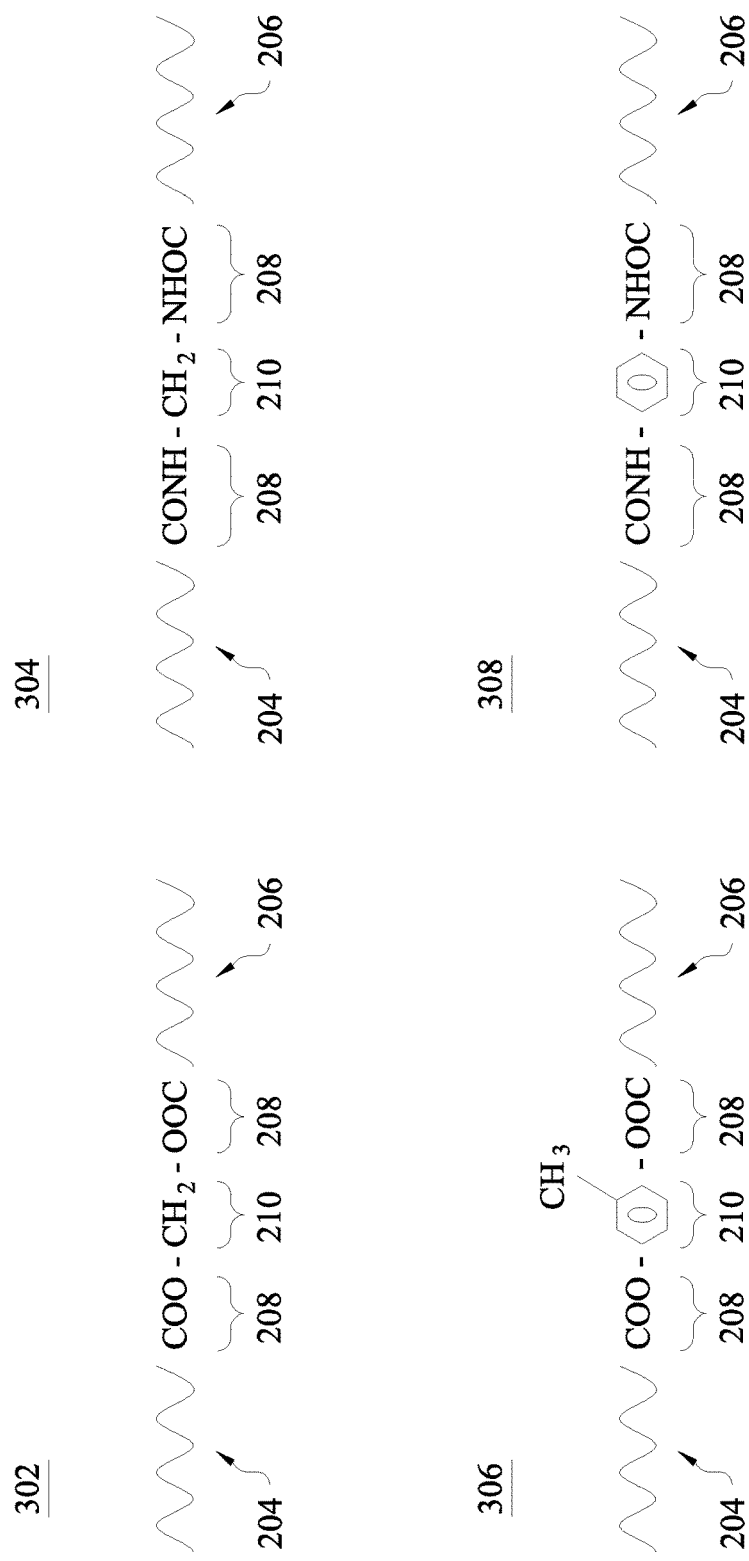
FIG. 3 shows examples of the polymer 200 of FIG. 2A prior to the first exposure process 106 with respect to the method of FIG. 1 according to various aspects of the present disclosure.

FIG. 3 illustrates examples of the embodiments of the polymer 200 of the photoresist layer prior to the first exposure process. In the illustrated embodiments, the polymer 200 may be implemented as chemical structure 302 that includes at least the first polymer segment 204, the second polymer segment 208, the UV curable group 208, and the linking group 210 as described above with respect to FIG. 2A. In some examples, the polymer 200 may be implemented as chemical structure 304 that includes at least the first polymer segment 204, the second polymer segment 208, the UV curable group 208, and the linking group 210. The polymer 200 may also be implemented as the chemical structure 306 that includes at least the first polymer segment 204, the second polymer segment 208, the UV curable group 208, and the linking group 210. Yet in some embodiments, the polymer 200 may be implemented as the chemical structure 308 that includes at least the first polymer segment 204, the second polymer segment 208, the UV curable group 208, and the linking group 210.

Figure 4:
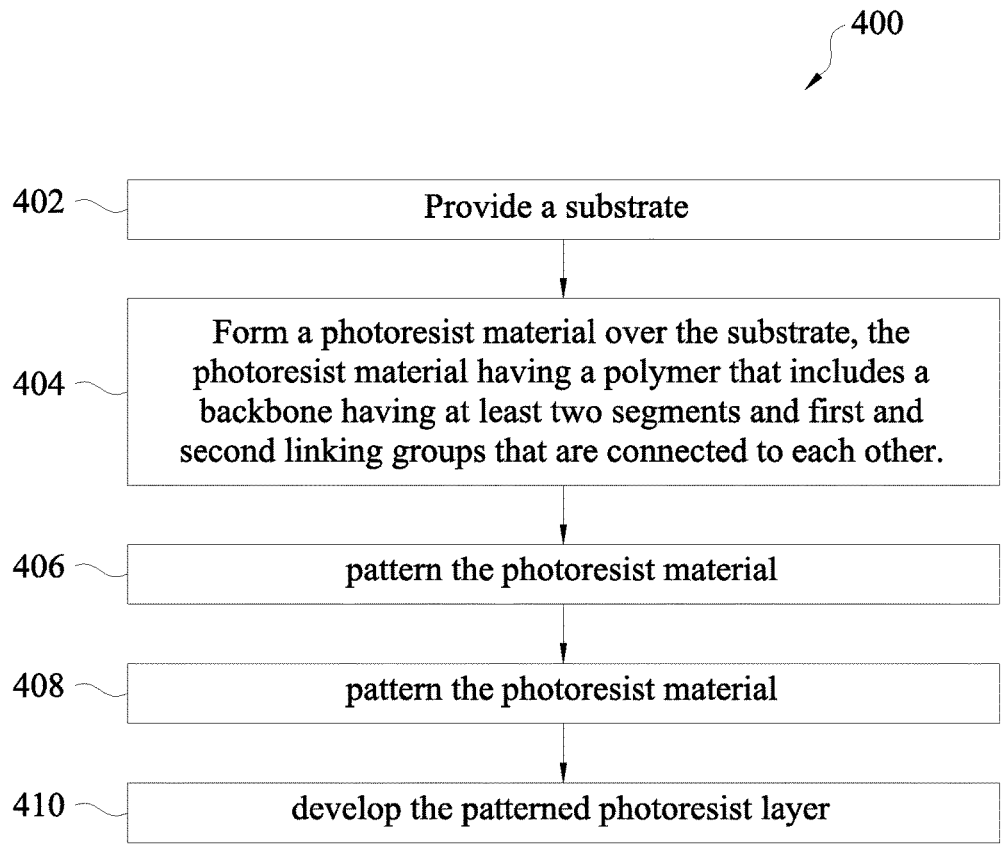
FIG. 4 is a flowchart of an embodiment of a method for making a semiconductor device according to various aspects of the present disclosure.

Referring now to FIG. 4, a method 400 of fabricating a semiconductor device in accordance with various embodiments is shown. The method 400 starts at block 402 with providing a substrate. In some embodiments, the substrate includes silicon. In some other embodiments, the substrate may alternatively or additionally include other suitable semiconductor material, such as germanium (Ge), silicon germanium (SiGe), silicon carbide (SiC), gallium arsenic (GaAs), diamond, indium arsenide (InAs), indium phosphide (InP), silicon germanium carbide (SiGeC), and gallium indium phosphide (GaInP). The substrate may also include various features such as various doped regions, shallow trench isolation (STI) regions, source/drain features, gate stacks, dielectric features, and/or multilevel interconnects.

The method continues to block 404 with forming a photoresist material over the substrate in accordance with various embodiments. The photoresist material has a polymer that includes a backbone having at least two segments and first and second linking groups. In some embodiments, the first and second linking groups are connected to each other. More specifically, the first and second linking groups are coupled between first and second segments of the at least two segments. Details of the photoresist material are described below with respect to FIG. 5A.

The method 400 then continues to block 406 where the substrate is exposed to a radiation beam thereby patterning the photoresist material. The radiation beam may expose the photoresist deposited on the substrate using a lithography system that provides a pattern of the radiation according to an IC design layout. In one embodiment, a lithography system includes an ultraviolet (UV) radiation, a deep ultraviolet (DUV) radiation, an extreme ultraviolet (EUV) radiation, an X-ray radiation, and/or other suitable radiation types. In alternative embodiments, a lithography system includes a charged particle lithography system, such as an electron beam or an ion beam lithography system.

Still referring to FIG. 4, subsequently, the method 400 continues to block 408 by performing a thermal treatment process on the patterned photoresist material. In some embodiments, this thermal treatment may be referred to as a post-baking process, or a post-exposure baking (PEB) process. During the post-baking process, the substrate with the patterned photoresist material is heated to an elevated baking temperature using a suitable baking mechanism, such as a hotplate or an oven. In one embodiment, the baking temperature may be performed at a temperature ranging between 100° C. and 250° C. hotter. Alternatively, other suitable baking temperatures may be used. In some embodiments, the post-baking process may be a hard baking process.

The method 400 continues to block 410 where the treated photoresist layer is developed to form a masking element. The masking element may be used to form a semiconductor device feature. A developer may be applied to the treated photoresist to form a photoresist pattern on the substrate. Here, the photoresist layer is a negative photoresist layer being developed by a negative tone developer in block 410. The term "negative tone developer" refers to a developer that selectively dissolves and removes areas that received no exposure dose (or an exposure dose below a predetermined threshold exposure dose value). In another embodiment, a developer may include an organic solvent or a mixture of organic solvents, such as methyl a-amyl ketone (MAK) or a mixture involving the MAK. In another embodiment, a developer includes a water based developer, such as tetramethylammonium hydroxide (TMAH). Applying a developer includes spraying a developer on the exposed photoresist layer, for example by a spin-on process. In an embodiment, the developer may remove the non-exposed regions of the resist leaving the portions have been exposed. In another embodiment, the photoresist layer is a positive photoresist layer being developed by a positive tone developer in block 410. The term "positive tone developer" refers to a developer that selectively dissolves and removes areas that received an exposure dose (or an exposure dose at or above a predetermined threshold exposure dose value).

The method 400 may continue with further steps not specifically described herein but understood by one of ordinary skill in the art. For example, the substrate may next be subjected to a rinsing process, such as a de-ionized (DI) water rinse. The rinsing process may remove residue particles.

In accordance with various illustrative embodiments, the photoresist material may contain a photo acid generator (PAG). In an embodiment, when absorbing photo energy (e.g., a radiation beam as illustrated in block 404 of FIG. 4), the PAG decomposes and forms an amount of acid. Examples of the PAG, that is, a compound capable of generating an acid upon exposure, are given below. It should be understood that they may be used alone or in combination as a mixture of two or more PAGs. Suitable PAGs include onium salts, selenium salts, phosphonium salts, iodonium, sulfonium salts, organic halogen compounds, O-nitrobenzylsulfonate compounds, N-iminosulfonate compounds, N-imidosulfonate compounds, diazosulfonate compound, sulfonimide compounds, diazodisulfonate compounds, and disulfone compounds.

In accordance with various illustrative embodiments, the photoresist material may also include a thermal acid generator (TAG). Upon a thermal treatment (e.g., the treatment process as illustrated in block 408 of FIG. 4), the TAG decomposes and forms an amount of acid. Generally, the TAG is thermally insensitive, which means that the TAG may form the acid in response to receiving thermal energy rather than photo energy. That is, the TAG does not form acid during the exposure process performed during block 406 described above. Instead, only the PAG in the photoresist layer forms acid during the exposure process performed during block 406.

As mentioned above, the thermal treatment process at block 408 may be performed at a temperature of about 250° C., more preferably about 150° C. or about 100° C. That is, in one embodiment, the thermal treatment process is performed at a temperature between about 100° C. to about 250° C. Examples of the TAGs used herein include ionic thermal acid generators, such as sulfonate salts that include fluorinated sulfonate salts. Embodiments of salts include ammonium salts. It should be understood that they TAGs be used alone or in combination in a mixture of two or more TAGs.

In some embodiments, the thermal acid generator produces an acid having a pKa of less than about 2 (or less than about 1, or less than about 0) upon the thermal treatment process. In some embodiments, the thermal acid generator does not contain an aromatic moiety. Still in some embodiments, the thermal acid generator comprises (or generates upon heating) an anion component having 1 or more carbon atoms.

Figure 5A:
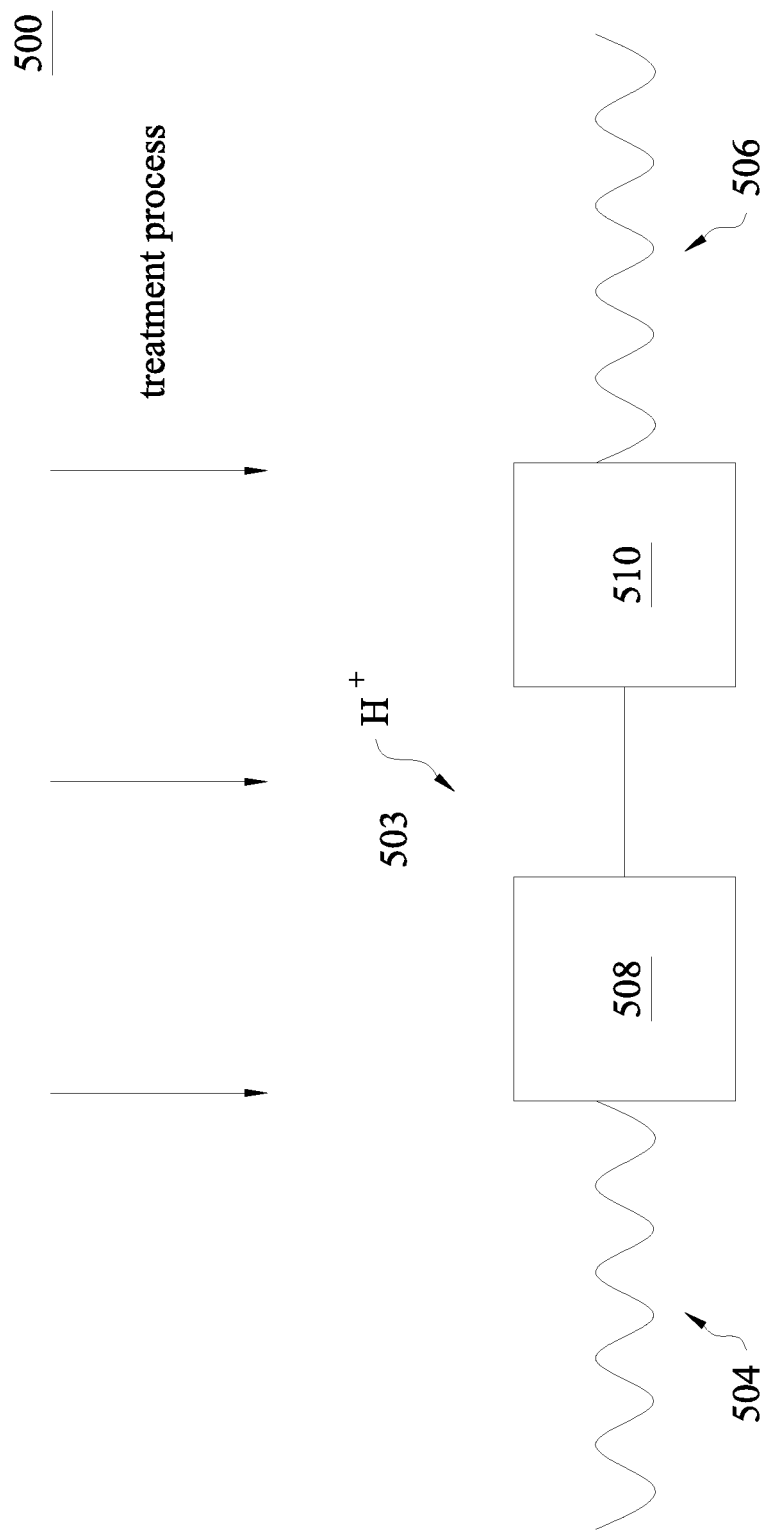
FIG. 5A is an illustrated embodiment of a photoresist material prior to a treatment process according to various aspects of the present disclosure.

FIG. 5A show a schematic view of an embodiment of a polymer 500 of the photoresist layer formed on the substrate prior to the treatment process (i.e., the thermal treatment process preformed at block 408 with respect to FIG. 4). As shown in FIG. 5A, the polymer 500 includes a polymer backbone, wherein the backbone further includes a first polymer segment 504, a second polymer segment 506, a first linking group 508, and a second linking group 510. In the illustrative embodiment of FIG. 5A, the first and second polymer segments are coupled to each other through the linkage of the first and second linking groups 508 and 510. The first and second polymer segments may include at least one of: a poly-hydroxy-styrene (PHS) polymer, an acrylate polymer, a carbon chain with 1~10 carbon atoms, and any suitable polymers known in the art. The first linking group 508 may have a chemical formula that includes at least one of: —S—, —P—, —P(O$_2$)—, —C(=O)S—, —C(=O)O—, —O—, —N—, —C(=O)N—, —SO$_2$O—, —SO$_2$S—, —SO—, —SO$_2$—. Regarding the second linking group 510, the second linking group 410 may include an acid-labile group (ALG), and/or a donor group having a lone pair such as —C—O—C—, —C(—OH)—, —C—NH—C—, —R(—NH$_2$)—, and —R—S—R—, wherein R may be an alkyl group with hydrogen attached to a hydrocarbon with a straight, branched, or cyclic structure. The alkyl group may also contain a hetero atom, such as a nitrogen or oxygen. In certain embodiments, the alkyl group may include one or more of CF$_3$, C$_2$F$_5$, or C$_3$F$_7$. In some other embodiment, the ALG is a compound that combines the function of both the ALG and a base. The base may include a nitrogen-containing base selected from any suitable base including an amine (—NH$_2$, —NHR), sulfonium amines (—SO$_2$NH$_2$, —SO$_2$NHR), —CONH$_2$, —CONHR, —CSNH$_2$, —C=CNH$_2$, —C=CNHR, pyridine-NH$_2$, phenyl-NH$_2$, pyrrole-NH$_2$, or thiophene-NH$_2$, where R represents an alkyl, aryl, substituted alkyl, substituted aryl, hetero aromatic ring, hetero atom, cyclic group, or substituted cyclic group. In some embodiments, the ALG-base compound includes a bulky unit with a tertiary carbon as a good leaving group. The ALG-base compound may be selected from esters, t-butyl, tert-butoxycarbonyl, iso-norbornyl, 2-methyl-2-adamantyl, 2-ethyl-2-adamantyl, 3-tetrahydrofuran (THF), lactone, 2-THF, or the 2-tetrahydropyranyl (THP) group. In various embodiments, the ALG-base compound includes a cross-linker site that can cross-link with the photoresist polymer after thermal baking. In other embodiments, the ALG-base compound does not include a cross-linker site and diffuses after thermal baking.

Figure 5B:
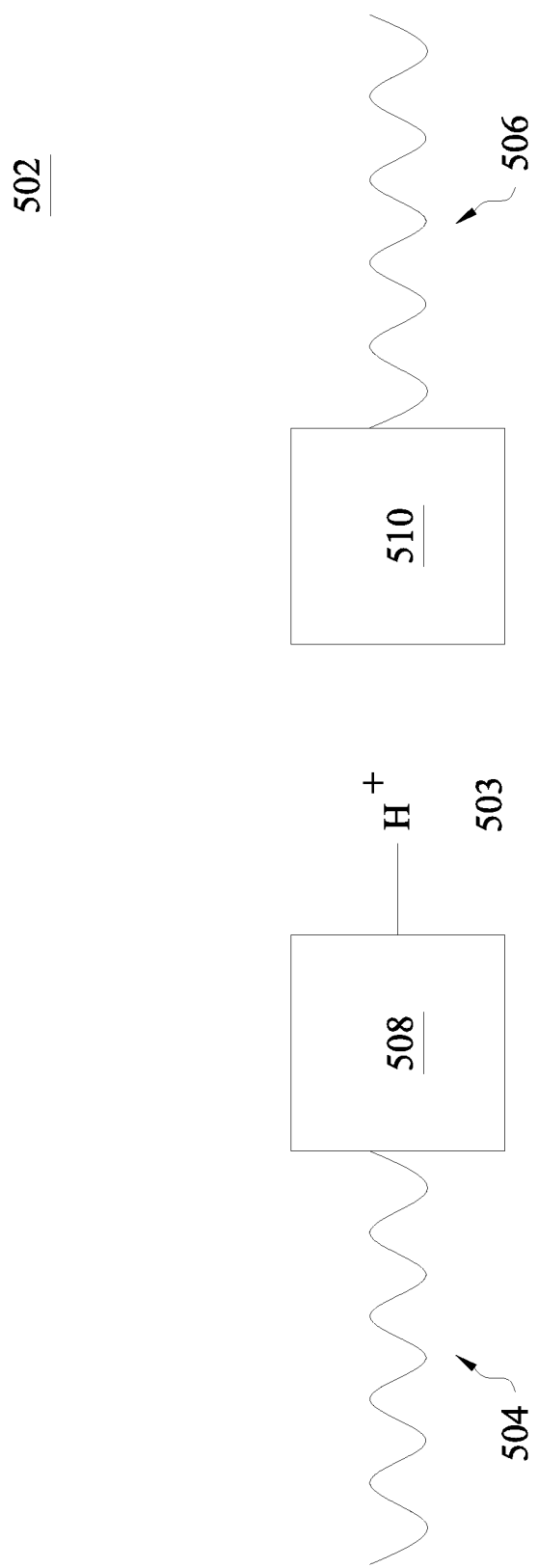
FIG. 5B is an illustrated embodiment of a photoresist material after a treatment process according to various aspects of the present disclosure.

Still referring to FIG. 5A, by performing a thermal treatment process (i.e., block 408 with respect to FIG. 4), the polymer backbone may divide into at least two segments by the first linking group 508 absorbing an acid 503. The acid 503 may be provided by the PAG and/or TAG. More specifically, during the exposure process (i.e., the block 406 with respect to FIG. 4), the acid 503 may be produced by the PAG; during the thermal treatment process (block 408), the acid 503 may be produced by the TAG. In accordance with various illustrative embodiments, neither the PAG nor TAG is included in the polymer backbone. FIG. 5B further shows a schematic view of an embodiment of the polymer 500 of the photoresist layer after the thermal treatment process (i.e., the block 408 with respect to FIG. 4). As shown in FIG. 5B, after the thermal treatment process, the first polymer segment 504 and the second polymer segment 506 are decoupled. More particularly, the first linking group 508 absorbs the acid 503 and the first linking group 508 and the second linking group 510 are disconnected and thus, in turn, the polymer backbone breaks into at least two polymer segments. Such breakage of the polymer backbone may advantageously provide a smaller grain size of polymer as discussed above.

Figure 6:
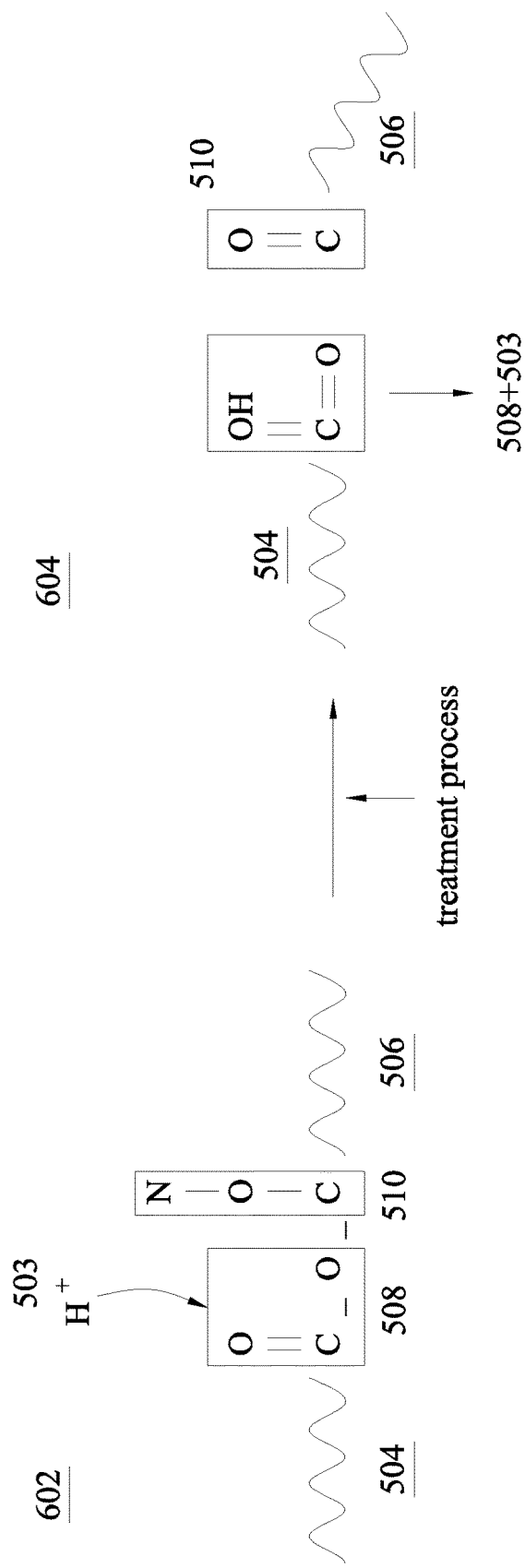
FIG. 6 shows an embodiment of breakage of a polymer backbone of a photoresist layer according to various aspects of the present disclosure.
Figure 7:
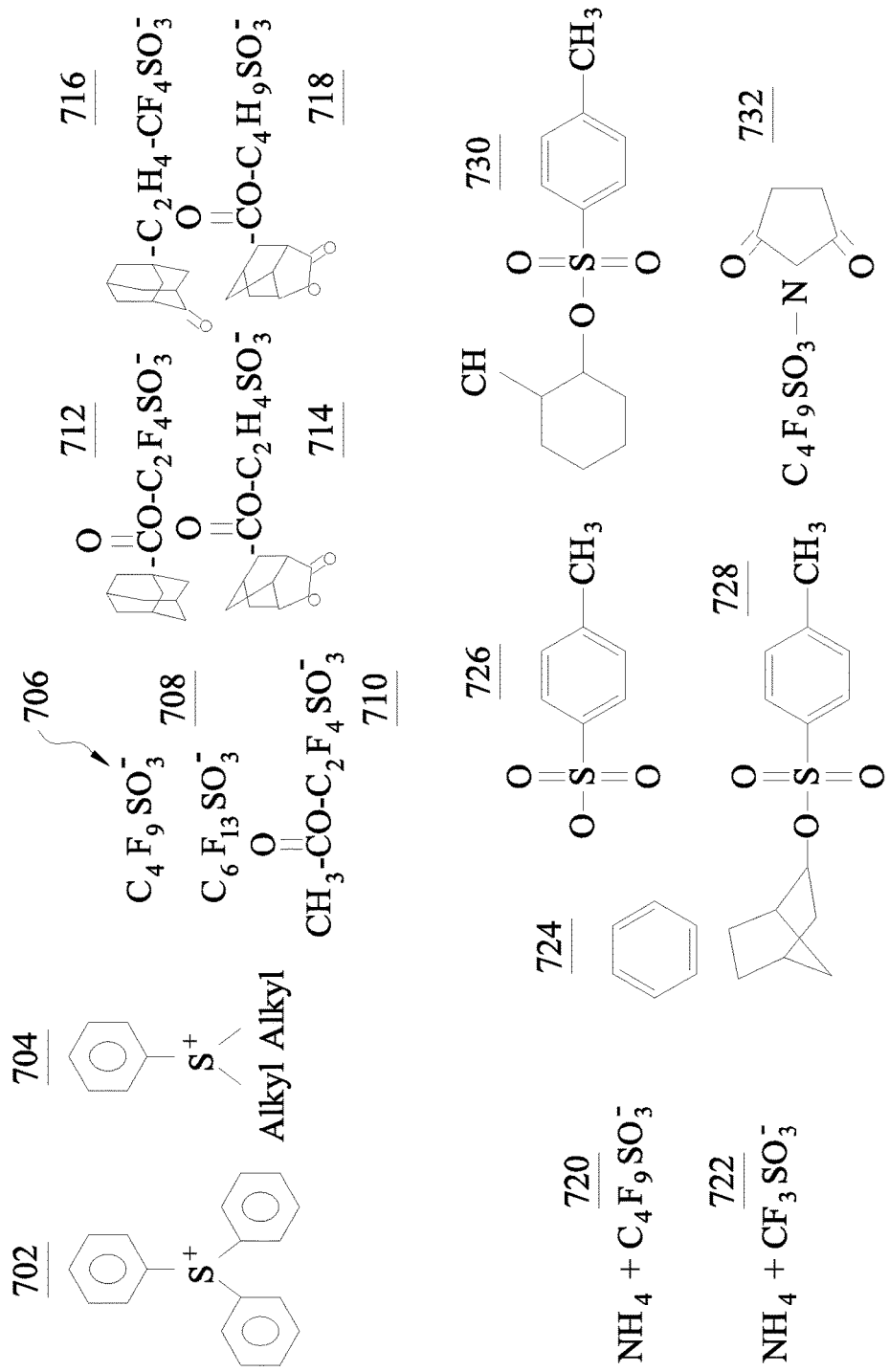
FIG. 7 shows examples of PAG and/or TAG that is included in a photoresist material according to various aspects of the present disclosure.

FIG. 6 shows an embodiment of the breakage of the polymer backbone of the photoresist layer. More specifically, 602 shows an example of the polymer backbone that includes, the first polymer segment 504, the second polymer segment 506, the first linking group 508 and the second linking group 510 prior to the treatment process (i.e., the thermal treatment process preformed at block 408 with respect to FIG. 4); 604 shows an example of the breakage of the polymer backbone via the first linking group 508 receiving the acid 503 from the PAG and/or TAG after the treatment process. FIG. 7 further shows examples of the PAG and the TAG. In some embodiments, the PAG may include at least one of 702, 704, 706, 708, 710, 712, 714, 716, and 718. The TAG may include at least one of 720, 722, 724, 726, 728, 730, and 732.

Various advantages may be present in one or more embodiments of the methods, devices and compositions described herein. The present disclosure provides a new material for a photoresist layer. Embodiments of these materials and methods using them, can provide an improved photoresist LWR (i.e., smaller LWR) by reducing the grain size of the photoresist polymer and/or narrowing the grain size distribution of the photoresist polymer. Further, such reduction of the grain size may be implemented via breaking the polymer backbone through either a pre-exposure UV process or a post-exposure baking process. As such, disclosed materials and methods may provide more accurate patterning, sharper pattern resolutions, lowered rework or scrap rates, and/or other benefits.

The present disclosure provides a method of fabricating a semiconductor device. In an embodiment, a method includes forming a photoresist material over a substrate, the photoresist material having a polymer that includes a backbone having a segment and a linking group, the segment including a carbon chain and an ultraviolet (UV) curable group, the UV curable group coupled to the carbon chain and to the linking group; performing a first exposure process that breaks the backbone of the polymer via decoupling the linking group from the connected UV curable group of each segment; performing a second exposure process to form a patterned photoresist layer; and developing the patterned photoresist layer.

In another embodiment, a method of making a semiconductor device includes forming a photoresist material over a substrate, the photoresist material having a polymer that includes a backbone having at least two segments and first and second linking groups that are connected to each other, wherein the first and second linking groups are coupled between first and second segments of the at least two segments; patterning the photoresist material to form a patterned photoresist layer; treating the patterned photoresist layer in a manner that breaks the backbone of the polymer by disconnecting the first and second linking groups; and developing the patterned photoresist layer.

Still in another embodiment, a photoresist material utilized in photolithography patterning includes a polymer having a backbone that is breakable. More specifically, the backbone includes at least two segments and a first linking group, wherein each segment includes a carbon chain and an ultraviolet (UV) curable group that is coupled to the carbon chain with the first linking group being connected.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   forming a photoresist material over a substrate, the photoresist material having a polymer that includes a backbone having two segments and a linking group, the two segments each including a carbon chain linked to an ultraviolet (UV) curable group, wherein each UV curable group is coupled to the linking group;
   performing a first exposure process that breaks the backbone of the polymer via decoupling the linking group from the UV curable group of each of the two segments;
   performing a second exposure process to form a patterned photoresist layer; and
   developing the patterned photoresist layer.

2. The method of claim 1, wherein performing the first exposure process includes performing the first exposure process without a photomask.

3. The method of claim 1, wherein performing the second exposure process includes performing the second exposure process with a photomask.

4. The method of claim 1, wherein performing the first exposure process includes exposing the photoresist material to an UV light source.

5. The method of claim 4, wherein the UV light source uses wavelength between 10 nanometers and 400 nanometers.

6. The method of claim 1, wherein performing the second exposure process includes exposing the photoresist material to a radiation source that includes at least one of: a radiation source using extreme ultraviolet (EUV) wavelength and an electron-beam (e-beam) source.

7. The method of claim 1, wherein the UV curable group has a chemical formula that comprises: —C(=O)S—, —C(=O)O—, —C(=O)NH—, —C(=O)ONH—, or —O—C(=O)O—.

8. The method of claim 1, wherein the linking group includes at least one of: branched-chain, unbranched-chain, cyclic saturated carbon chains, and noncyclic saturated carbon chains.

9. A photoresist, comprising:
   a polymer having a backbone that is breakable by radiation exposure,
   wherein the backbone includes two segments, a first linking group, and a second linking group connected to the first linking group,
   wherein the first linking group and the second linking group are disposed between the two segments,
   wherein each of the two segments includes a poly-hydroxy-styrene (PHS) polymer,
   wherein the first linking group includes —P(O$_2$)—, —C(=O)S—, —C(=O)O—, —SO$_2$S—, —SO—, —SO$_2$—, or combinations thereof,
   wherein the second linking group includes an acid-labile group (ALG) and a donor group including —C—NH—C—, —R(—NH$_2$)—, or combinations thereof,
   wherein the ALG includes an ester, t-butyl, tert-butoxy-carbonyl, iso-norbornyl, 2-methyl-2-adamantyl, 2-ethyl-2-adamantyl, 3-tetrahydrofuran (THF), 2-THF, 2-tetrahydropyranyl (THP) group, or combinations thereof, and
   wherein R is an alkyl group including a hydrogen attached to a hydrocarbon with a straight, branched, or cyclic structure.

10. The photoresist of claim 9, wherein R includes a hetero atom.

11. The photoresist of claim 9, wherein each of the two segments further includes an acrylate polymer.

12. The photoresist of claim 9, wherein R includes one or more of $CF_3$, $C_2F_5$, or $C_3F_7$.

13. A method of fabricating a semiconductor device, comprising:
   forming a photoresist material over a substrate, the photoresist material having a polymer that includes a backbone comprising:
   a first UV curable group;
   a second UV curable group;
   a first linking group connected to the first UV curable group and the second UV curable group, wherein each of the first and the second UV curable group is further connected to a polymer segment comprising at least one of: a poly-hydroxy-styrene (PHS), an acrylate, or a carbon chain having 1-10 carbon atoms;
   performing a first exposure process that decouples the first linking group from both the first UV curable group and the second UV curable group such that the backbone is broken;
   performing a second exposure process to form a patterned photoresist layer; and
   developing the patterned photoresist layer.

14. The method of claim 13, wherein performing the first exposure process includes performing the first exposure process without a photomask.

15. The method of claim 13, wherein performing the second exposure process includes performing the second exposure process with a photomask.

16. The method of claim 13, wherein performing the first exposure process includes exposing the photoresist material to an UV light source.

17. The method of claim 16, wherein the UV light source uses wavelength between 10 nanometers and 400 nanometers.

18. The method of claim 13, wherein performing the second exposure process includes exposing the photoresist material to a radiation source that includes at least one of: a radiation source using extreme ultraviolet (EUV) wavelength and an electron-beam (e-beam) source.

19. The method of claim 13, wherein the first linking group includes at least one of: branched-chain, unbranched-chain, cyclic saturated carbon chains, and noncyclic saturated carbon chains.

20. The method of claim 13, wherein each of the first and the second UV curable group includes at least one of —C(=O)S—, —C(=O)O—, —C(=O)NH—, —C(=O)ONH—, or —O—C(=O)O—.

* * * * *